US012311664B2

(12) United States Patent
Hamada et al.

(10) Patent No.: US 12,311,664 B2
(45) Date of Patent: May 27, 2025

(54) PIEZOELECTRIC ELEMENT, HEAD CHIP, LIQUID EJECTION DEVICE, AND SENSOR

(71) Applicant: SEIKO EPSON CORPORATION, Tokyo (JP)

(72) Inventors: Yasuaki Hamada, Chino (JP); Yoshiki Yano, Chino (JP); Kazuya Kitada, Matsumoto (JP); Koji Ohashi, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 180 days.

(21) Appl. No.: 18/192,795

(22) Filed: Mar. 30, 2023

(65) Prior Publication Data

US 2023/0311504 A1 Oct. 5, 2023

(30) Foreign Application Priority Data

Mar. 31, 2022 (JP) .................. 2022-059214

(51) Int. Cl.
*B41J 2/14* (2006.01)
*H10N 30/20* (2023.01)
*H10N 30/853* (2023.01)

(52) U.S. Cl.
CPC ....... *B41J 2/14233* (2013.01); *B41J 2/14201* (2013.01); *B41J 2002/14258* (2013.01); *H10N 30/2047* (2023.02); *H10N 30/8542* (2023.02)

(58) Field of Classification Search
CPC ............... B41J 2/14233; B41J 2/14201; B41J 2002/14258; H10N 30/2047; H10N 30/8542
See application file for complete search history.

(56) References Cited

U.S. PATENT DOCUMENTS

| 2007/0159028 A1 | 7/2007 | Nagaya et al. | |
| 2010/0320871 A1 | 12/2010 | Suenaga et al. | |
| 2012/0086757 A1* | 4/2012 | Kitada | B41J 2/14233 347/68 |
| 2016/0294306 A1* | 10/2016 | Kobayashi | H10N 30/704 |

FOREIGN PATENT DOCUMENTS

| JP | 2010-16018 | * | 1/2010 | ............. H01L 41/09 |
| JP | 2012-240366 A | | 12/2012 | |

* cited by examiner

*Primary Examiner* — Geoffrey S Mruk
(74) *Attorney, Agent, or Firm* — Harness, Dickey & Pierce, P.L.C.

(57) ABSTRACT

A piezoelectric element according to the present disclosure includes: a first electrode; a piezoelectric layer formed at an upper part of the first electrode; and a second electrode formed at an upper part of the piezoelectric layer, in which the piezoelectric layer contains potassium, sodium, and niobium, and a Young's modulus of the piezoelectric layer measured by a nanoindentation method exceeds 130 GPa.

7 Claims, 6 Drawing Sheets

PIEZOELECTRIC ELEMENT, HEAD CHIP, LIQUID EJECTION DEVICE, AND SENSOR

The present application is based on, and claims priority from JP Application Serial Number 2022-059214, filed Mar. 31, 2022, the disclosure of which is hereby incorporated by reference herein in its entirety.

BACKGROUND

1. Technical Field

The present disclosure relates to a piezoelectric element, a head chip, a liquid ejection device, and a sensor.

2. Related Art

A piezoelectric element generally includes a substrate, a piezoelectric layer having an electromechanical conversion characteristic, and two electrodes sandwiching the piezoelectric layer. In recent years, development of devices (piezoelectric element application devices) using such a piezoelectric element as a driving source has been actively performed. One of the piezoelectric element application devices is a liquid ejection head represented by an ink jet recording head, a MEMS element represented by a piezoelectric MEMS element, an ultrasonic measurement device represented by an ultrasonic sensor, and further, a piezoelectric actuator device.

As an example of the piezoelectric element, for example, JP-A-2012-240366 discloses a piezoelectric element including a piezoelectric layer (PZT layer) containing lead, zirconium, and titanium and having a Young's modulus of 75 GPa, and a first electrode (platinum layer) having a Young's modulus of 200 GPa.

Here, in recent years, a non-lead-based piezoelectric material having a reduced lead (Pb) content has been developed from the viewpoint of environmental loading reduction. Potassium sodium niobate (KNN; $(K,Na)NbO_3$), for example, has been proposed as a main material for the piezoelectric element having a low lead content.

However, as described in JP-A-2012-240366, when an upper electrode having a large Young's modulus is provided on a piezoelectric layer having a small Young's modulus, the piezoelectric layer may be deformed by a stress received from the upper electrode, and accordingly, deflection (initial deflection) of a diaphragm toward a pressure chamber side may occur.

The piezoelectric layer having the small Young's modulus cannot sufficiently bend the diaphragm when a piezoelectric element is driven, and a displacement amount may be reduced (linearity deteriorates) in particular when the piezoelectric element is driven at a high voltage.

In a case of a relatively soft piezoelectric layer having a small Young's modulus, fluctuation at the time of driving the piezoelectric element is not sufficiently transmitted to the diaphragm, and a part of the driving is consumed by deformation of the piezoelectric layer itself. Therefore, particularly at a high voltage, the larger the fluctuation is, the larger a proportion of a driving force consumed by the deformation of the piezoelectric layer itself, and efficiency of the fluctuation on the diaphragm is lowered.

The relatively soft piezoelectric layer may not withstand the stress from the upper electrode (second electrode) from a stage of deposition and may be deformed, and as a result, the initial deflection of the diaphragm may increase. When the deflection of the diaphragm toward the pressure chamber side occurs, a volume of a pressure chamber decreases, leading to, for example, a decrease in a liquid droplet ejection amount.

Under such circumstances, there is a demand for a piezoelectric element capable of reducing a decrease in efficiency of the displacement amount (linearity) of the diaphragm even when the piezoelectric element is driven at a high voltage (for example, 20 V to 50 V).

Such a problem is not limited to a piezoelectric element used in a piezoelectric actuator mounted on a liquid ejection head represented by an ink jet recording head, but similarly in a piezoelectric element used in another piezoelectric element application device.

SUMMARY

A first aspect of the present disclosure provides a piezoelectric element including: a first electrode; a piezoelectric layer formed at an upper part of the first electrode; and a second electrode formed at an upper part of the piezoelectric layer, in which the piezoelectric layer contains potassium, sodium, and niobium, and a Young's modulus of the piezoelectric layer measured by a nanoindentation method exceeds 130 GPa.

A second aspect of the present disclosure provides a head chip including: a nozzle plate including a nozzle for ejecting a liquid droplet; a pressure generation chamber communicating with the nozzle; a flow path forming substrate disposed on the nozzle plate and forming the pressure generation chamber; a diaphragm forming a part of a wall surface of the pressure generation chamber; the piezoelectric element according to the first aspect provided on the diaphragm; and a voltage application portion configured to apply a voltage to the piezoelectric element.

A third aspect of the present disclosure provides a liquid ejection device including: a conveyance unit configured to convey media; and a liquid droplet ejection head configured to apply a liquid droplet to the media, in which the liquid droplet ejection head includes the head chip according to the second aspect.

A fourth aspect of the present disclosure provides a sensor including: the piezoelectric element according to the first aspect; and a voltage detection unit configured to detect a voltage output from the piezoelectric element.

DESCRIPTION OF EXEMPLARY EMBODIMENTS

Figure 1:
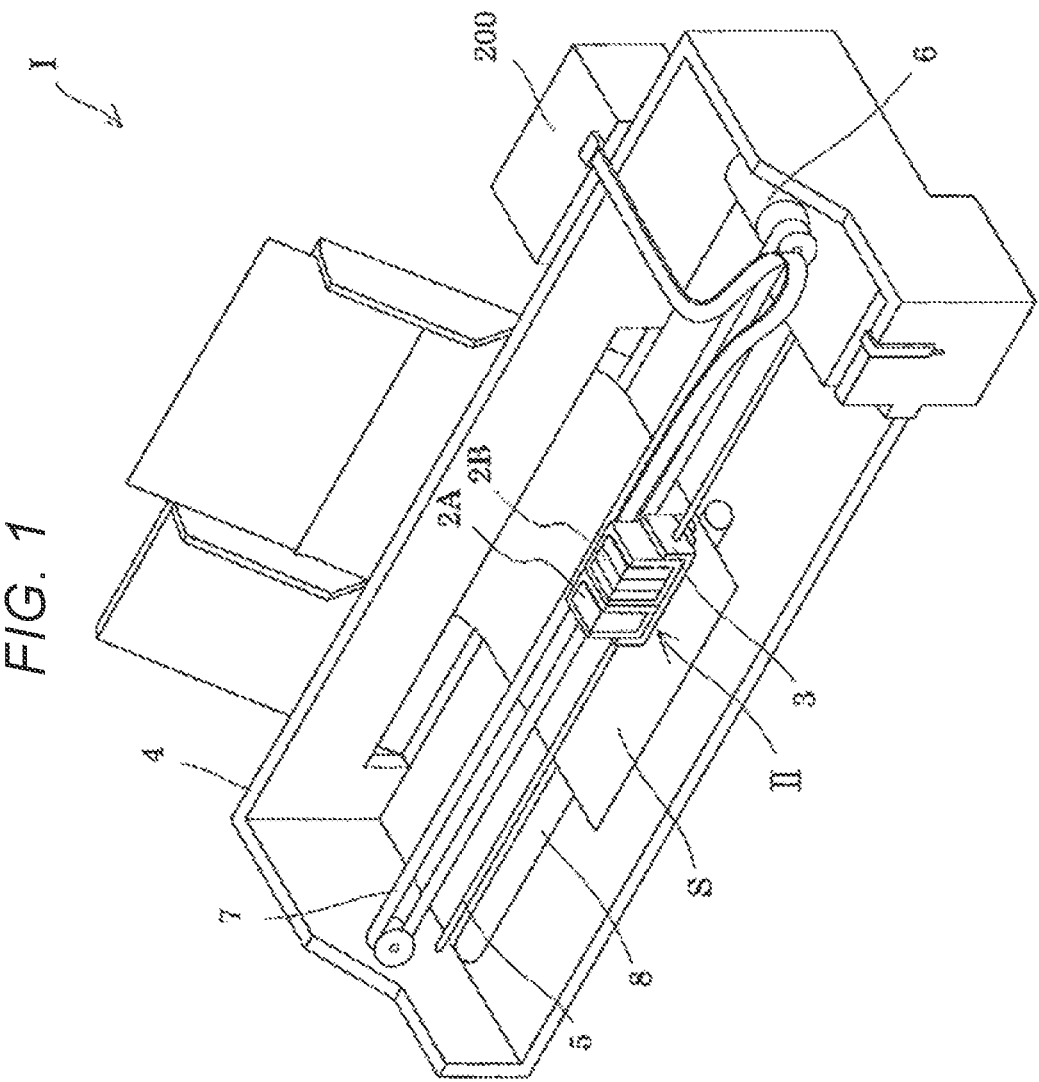
FIG. 1 is a perspective view showing a schematic configuration of a recording device according to a first embodiment.

Hereinafter, an embodiment of the present disclosure will be described with reference to the drawings. The following description shows an aspect of the present disclosure, and can be freely changed without departing from the gist of the present disclosure. In the drawings, the same reference signs denote the same members, and the description thereof is omitted as appropriate. The number after a letter which makes up the reference sign is referenced by a reference sign which includes the same letter and is used to distinguish between elements which have similar configurations. When it is not necessary to distinguish elements indicated by the reference signs which include the same letter from each other, each of the elements is referenced by a reference sign containing only a letter.

In each drawing, X, Y, and Z represent three spatial axes orthogonal to one another. In the present description, directions along these axes are referred to as a first direction X (X direction), a second direction Y (Y direction), and a third direction Z (Z direction), respectively, a direction of an arrow in each drawing is referred to as a positive (+) direction, and a direction opposite from the arrow is referred to as a negative (−) direction. The X direction and the Y direction represent in-plane directions of a plate, a layer, and a film, and the Z direction represents a thickness direction or a stacking direction of a plate, a layer, and a film.

Components shown in each drawing, that is, a shape and size of each part, a thickness of a plate, a layer, and a film, a relative positional relation, a repeating unit, and the like may be exaggerated for describing the present disclosure. Furthermore, the term "on" in the present description does not limit that a positional relation between the components is "directly on". For example, expressions such as "a first electrode on a substrate" and "a piezoelectric layer on the first electrode", which will be described later, do not exclude those including other components between the substrate and the first electrode or between the first electrode and the piezoelectric layer.

Liquid Ejection Device

First, an ink jet recording device, which is an example of a liquid ejection device according to the embodiment of the present disclosure, will be described with reference to the drawings. FIG. 1 is a perspective view showing a schematic configuration of the ink jet recording device.

As shown in FIG. 1, in an ink jet recording device (recording device) I, an ink jet recording head unit (liquid droplet ejection head and head unit) II is detachably provided in cartridges 2A and 2B. The cartridges 2A and 2B constitute an ink supply unit. The head unit II includes a plurality of ink jet recording heads (head chips and recording heads) 1 (see FIG. 2 and the like), and is mounted on a carriage 3. The carriage 3 is movable in an axial direction on a carriage shaft 5 attached to a device main body 4. The head unit II and the carriage 3 can eject, for example, a black ink composition and a color ink composition, respectively.

A driving force of a drive motor 6 is transmitted to the carriage 3 via a plurality of gears (not shown) and a timing belt 7, so that the carriage 3 on which the head unit II is mounted is moved along the carriage shaft 5. On the other hand, the device main body 4 is provided with a conveyance roller 8 as a conveyance unit, and a recording sheet S which is a recording medium (media) such as paper is conveyed by the conveyance roller 8. The conveyance unit which conveys the recording sheet S is not limited to a conveyance roller, and may be a belt, a drum, or the like.

In the recording head (head chip) 1, a piezoelectric element 300 (see FIG. 2 and the like), which will be described in detail later, is used as a piezoelectric actuator device. By using the piezoelectric element 300, it is possible to avoid deterioration of various characteristics (piezoelectric characteristics, durability, ink ejection characteristics, and the like) in the recording device I. In particular, the liquid ejection device according to the embodiment can sufficiently reduce a decrease in the piezoelectric characteristics (in particular, a displacement amount) by applying the piezoelectric element 300 to be described later.

Figure 2:
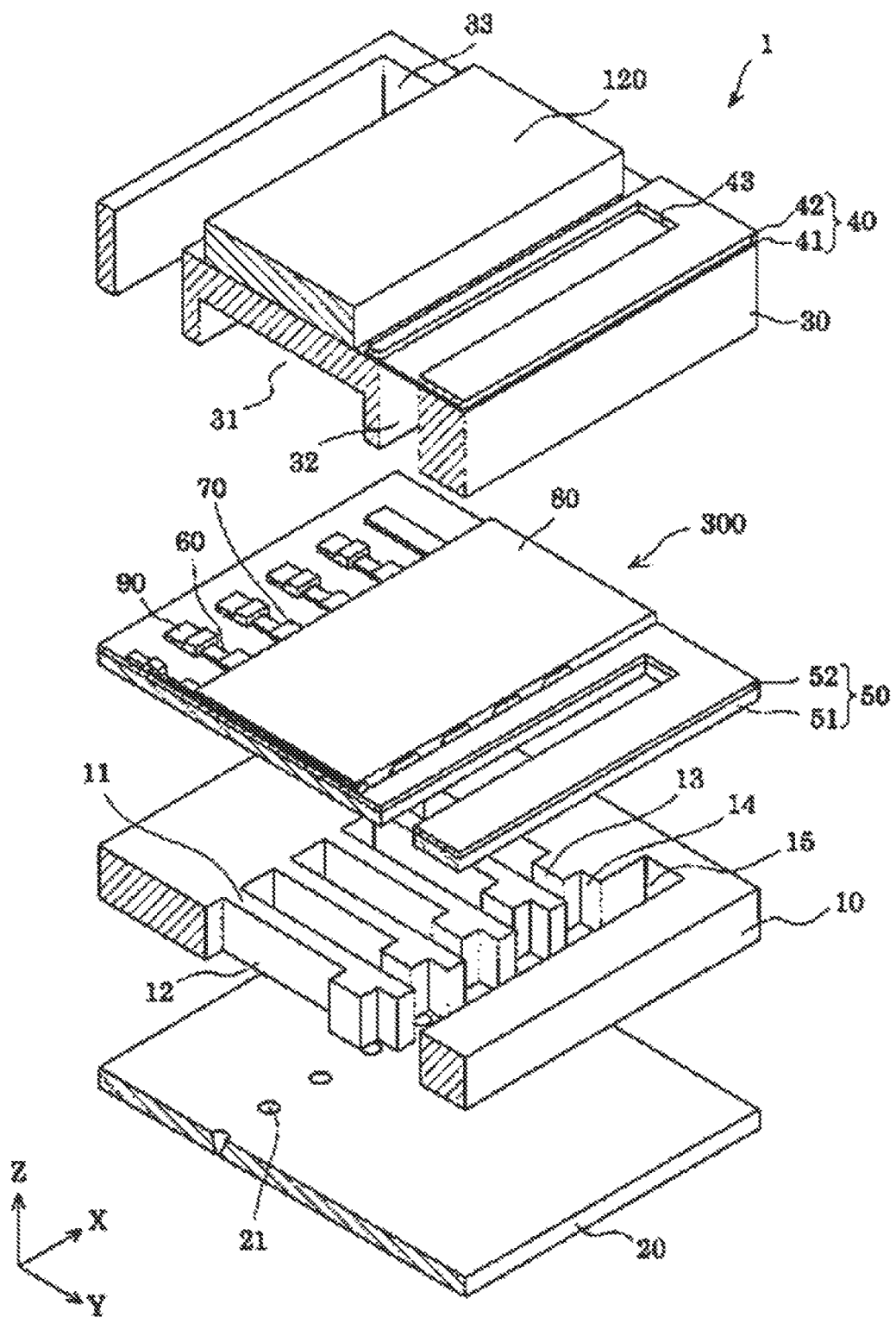
FIG. 2 is an exploded perspective view of a recording head of the recording device in FIG. 1.
Figure 3:
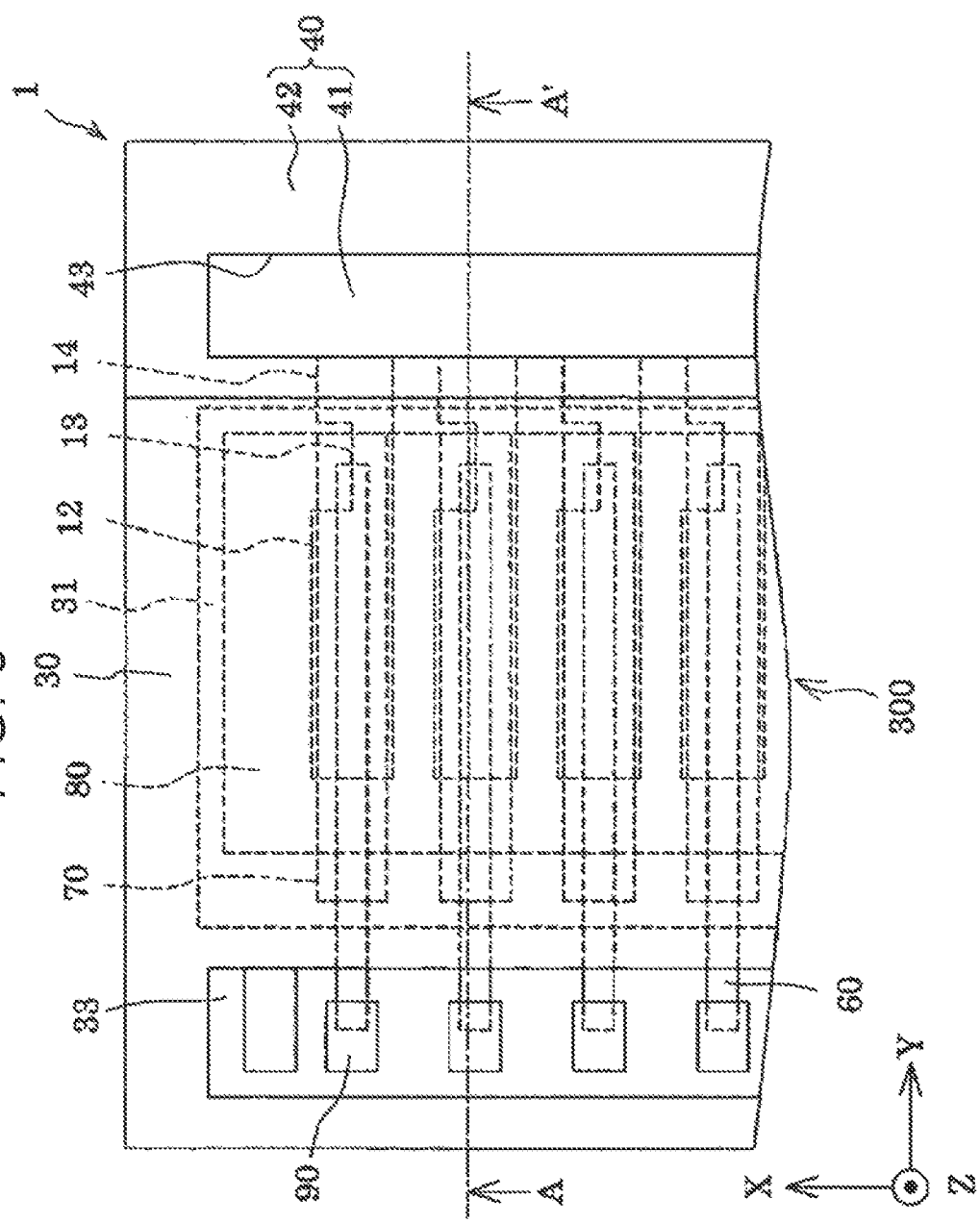
FIG. 3 is a plan view of the recording head of the recording device in FIG. 1.
Figure 4:
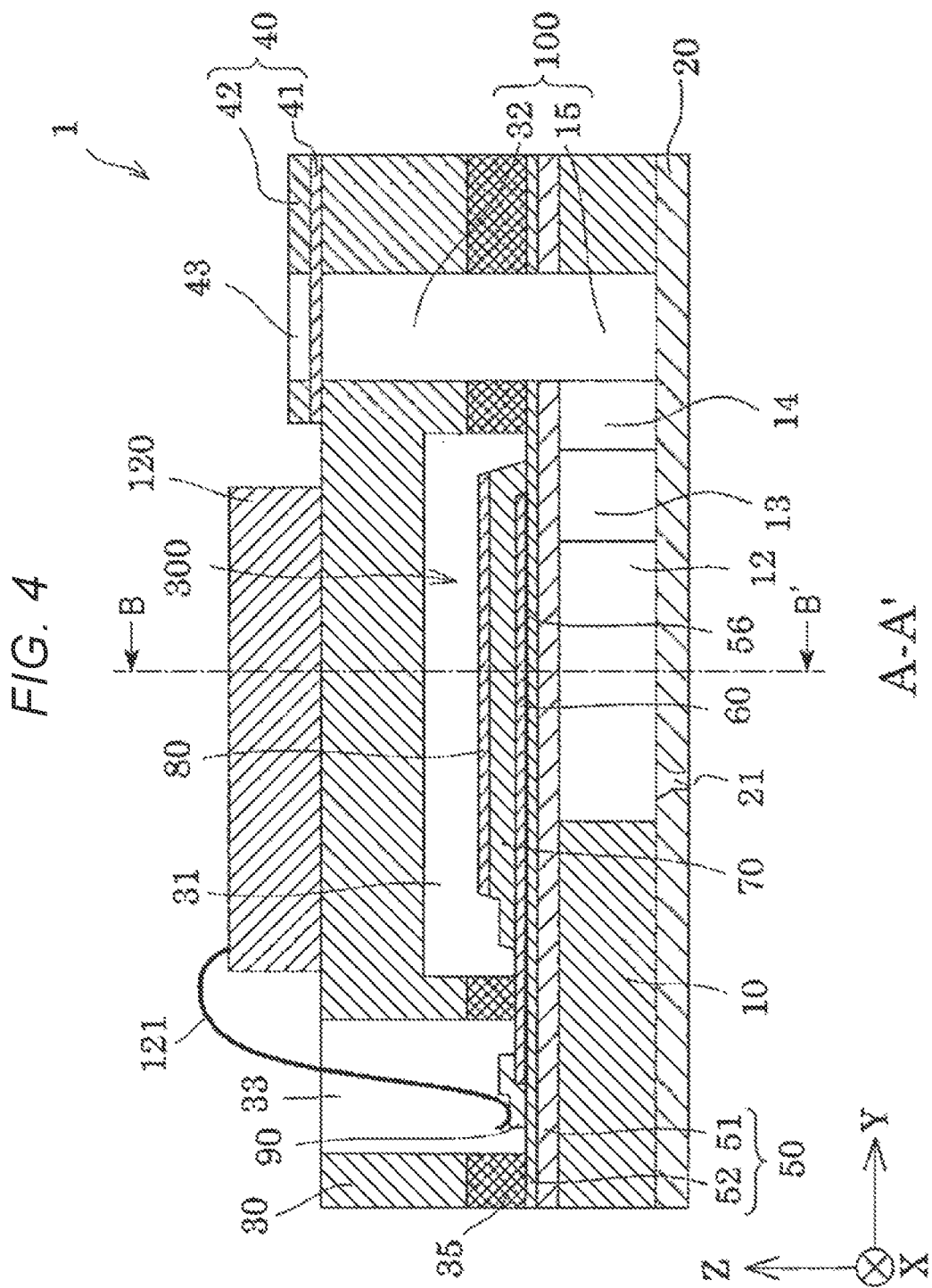
FIG. 4 is a cross-sectional view of the recording head of the recording device in FIG. 1.

Next, the recording head (head chip) 1, which is an example of the head chip mounted on the liquid ejection device, will be described with reference to the drawings. FIG. 2 is an exploded perspective view showing a schematic configuration of the ink jet recording head. FIG. 3 is a plan view showing the schematic configuration of the ink jet recording head. FIG. 4 is a cross-sectional view taken along a line A-A' in FIG. 3. FIGS. 2 to 4 each show a part of a configuration of the recording head 1, and are omitted as appropriate.

As shown in FIG. 2, the recording head (head chip) 1 includes a nozzle plate 20 having nozzles 21 for ejecting liquid droplets, pressure generation chambers 12 communicating with the nozzles 21, a substrate 10 and partition walls (flow path forming substrate) 11 provided on the nozzle plate 20 and forming the pressure generation chambers 12, a diaphragm 50 forming a part of wall surfaces of the pressure generation chambers 12, the piezoelectric element 300 provided on the diaphragm 50, and lead electrodes (voltage application portions) 90 which apply voltages to the piezoelectric element 300.

The substrate 10 contains silicon (Si). For example, the substrate 10 is made of a silicon (Si) single crystal substrate.

A plurality of partition walls 11 are formed in the substrate 10. A plurality of pressure generation chambers 12 are partitioned by the partition walls 11. The pressure generation chambers 12 are arranged side by side along a direction (+X direction) in which a plurality of nozzles 21 for ejecting ink of the same color are arranged side by side.

In the substrate 10, ink supply paths 13 and communication paths 14 are formed at one end portion side (+Y direction side) of each of the pressure generation chambers 12. Each of the ink supply paths 13 is formed such that an area of an opening at the one end portion side of the pressure generation chamber 12 is reduced. Each of the communication paths 14 has substantially the same width as the pressure generation chamber 12 in the +X direction. A communication portion 15 is formed at an outer side (+Y direction side) of the communication path 14. The communication portion 15 constitutes a part of a manifold 100. The manifold 100 serves as a common ink chamber for each pressure generation chamber 12. Thus, a liquid flow path including the pressure generation chamber 12, the ink supply path 13, the communication path 14, and the communication portion 15 is formed in the substrate 10.

On one surface (a surface on a −Z direction side) of the substrate 10, the nozzle plate 20 made of, for example, SUS is bonded. In the nozzle plate 20, the nozzles 21 are arranged side by side along the +X direction. The nozzles 21 communicate with the pressure generation chambers 12. The nozzle plate 20 can be bonded to the substrate 10 by an adhesive, a thermal welding film, or the like.

The diaphragm 50 is formed on the other surface (a surface at a +Z direction side) of the substrate 10. The diaphragm 50 includes, for example, an elastic film 51 formed on the substrate 10 and an insulator film 52 formed on the elastic film 51. The elastic film 51 is made of, for example, silicon dioxide ($SiO_2$), and the insulator film 52 is made of, for example, zirconium oxide ($ZrO_2$). The elastic film 51 may not be a separate member from the substrate 10. A part of the substrate 10 may be processed to be thin and used as the elastic film 51. The elastic film 51 is not limited to $SiO_2$, and may be a film made of aluminum oxide ($Al_2O_3$), tantalum oxide (V) ($Ta_2O_5$), silicon nitride (SiN), and the like.

The piezoelectric element 300 including first electrodes 60, piezoelectric layers 70, and a second electrode 80 is formed on the insulator film 52 via an adhesion layer 56. The adhesion layer 56 is made of, for example, titanium oxide ($TiO_x$), titanium (Ti), or SiN, and has a function of improving adhesion between the piezoelectric layer 70 and the diaphragm 50. The adhesion layer 56 may be omitted.

Each of the piezoelectric layers 70 is made of a so-called KKK-based material containing potassium, sodium, and niobium, and these alkali metals may diffuse into each of the first electrodes 60 in a process of forming the piezoelectric layer 70. Therefore, by providing the insulator film 52 between the first electrode 60 and the substrate 10 and having the insulator film 52 function as a stopper, the alkali metals constituting the piezoelectric layer 70 can be prevented from reaching the substrate 10.

The first electrode 60 is provided for each pressure generation chamber 12. That is, the first electrode 60 is provided as an individual electrode for each pressure generation chamber 12. The first electrode 60 has a width smaller than a width of the pressure generation chamber 12 in the +X direction and in a −X direction. The first electrode 60 has a width larger than a width of the pressure generation chamber 12 in the +Y direction and in a −Y direction. That is, in the +Y direction and in the −Y direction, both end portions of the first electrode 60 are formed up to an outside of a region on the diaphragm 50 facing the pressure generation chamber 12. At one end portion side (an opposite side from the communication path 14) of the first electrode 60, the lead electrodes (voltage application portions) 90 which apply voltages to the piezoelectric element 300 are coupled.

The piezoelectric layer 70 is provided between the first electrode 60 and the second electrode 80. The piezoelectric layer 70 is a thin-film piezoelectric substance. The piezoelectric layer 70 has a width larger than the width of the first electrode 60 in the +X direction and in the −X direction. The piezoelectric layer 70 has a width larger than a length of the pressure generation chamber 12 in the +Y direction and in the −Y direction. An end portion of the piezoelectric layer 70 at an ink supply path 13 side (+Y direction side) is formed up to an outside of an end portion of the first electrode 60 at the +Y direction side. That is, the end portion of the first electrode 60 at the +Y direction side is covered with the piezoelectric layer 70. On the other hand, an end portion of the piezoelectric layer 70 at a lead electrode 90 side (−Y direction side) is at an inner side (+Y direction side) of an end portion of the first electrode 60 at the −Y direction side. That is, the end portion of the first electrode 60 at the −Y direction side is not covered with the piezoelectric layer 70.

The second electrode 80 is continuously provided on the piezoelectric layer 70 and the diaphragm 50 over the +X direction. That is, the second electrode 80 is configured as a common electrode common to the plurality of piezoelectric layers 70. In the embodiment, the first electrode 60 constitutes an individual electrode provided independently corresponding to the pressure generation chamber 12, and the second electrode 80 constitutes a common electrode provided continuously in a direction in which the pressure generation chambers 12 are arranged side by side. Alternatively, the first electrode 60 may constitute the common electrode, and the second electrode 80 may constitute the individual electrode.

In the embodiment, the diaphragm 50 and the first electrode 60 are displaced by displacement of the piezoelectric layer 70 having an electromechanical conversion characteristic. That is, the diaphragm 50 and the first electrode 60 substantially function as a diaphragm. In practice, since the second electrode 80 is also displaced due to displacement of the piezoelectric layer 70, a region in which the diaphragm 50, the first electrode 60, the piezoelectric layer 70, and the second electrode 80 are sequentially stacked functions as a movable portion (also referred to as a vibration portion) of the piezoelectric element 300.

In the embodiment, either the elastic film 51 or the insulator film 52 may be omitted so that the remaining one functions as the diaphragm, or the elastic film 51 and insulator film 52 may be omitted so that only the first electrode 60 functions as the diaphragm.

On the substrate 10 (diaphragm 50) on which the piezoelectric element 300 is formed, a protective substrate 30 is bonded by an adhesive 35. The protective substrate 30 has a manifold portion 32. At least a portion of the manifold 100 is implemented by the manifold portion 32. The manifold portion 32 according to the embodiment penetrates the protective substrate 30 in the thickness direction (Z direction), and is further formed over a width direction (+X direction) of the pressure generation chamber 12. The manifold portion 32 communicates with the communication portion 15 in the substrate 10. With these configurations, the manifold 100, which is the common ink chamber for each pressure generation chamber 12, is formed.

The protective substrate 30 has a piezoelectric element holding portion 31 formed in a region including the piezoelectric element 300. The piezoelectric element holding portion 31 has enough space not to interfere with movement of the piezoelectric element 300. This space may or may not be sealed. The protective substrate 30 is provided with a through hole 33 penetrating the protective substrate 30 in the thickness direction (Z direction). An end portion of each of the lead electrodes 90 is exposed in the through hole 33.

Examples of a material for the protective substrate 30 include Si, SOI, glass, a ceramic material, a metal, and a resin, and it is more preferable that the protective substrate 30 is formed of a material having substantially the same coefficient of thermal expansion as that of the substrate 10.

A drive circuit 120 functioning as a signal processing unit is fixed on the protective substrate 30. As the drive circuit 120, for example, a circuit board or a semiconductor integrated circuit (IC) can be used. The drive circuit 120 and the lead electrode 90 are electrically coupled to each other via a coupling wiring 121 made of a conductive wire such as a bonding wire inserted through the through hole 33. The drive circuit 120 can be electrically coupled to a printer controller 200 (see FIG. 1). Such a drive circuit 120 functions as a control unit for the piezoelectric actuator device (piezoelectric element 300).

On the protective substrate 30, a compliance substrate 40 including a sealing film 41 and a fixing plate 42 is bonded. The sealing film 41 is made of a material having low rigidity, and the fixing plate 42 can be made of a hard material such as a metal. A region of the fixing plate 42 facing the manifold 100 is an opening 43 with a part completely removed in the thickness direction (Z direction). One surface (a surface at a +Z direction side) of the manifold 100 is sealed only with the sealing film 41 having flexibility.

Such a recording head 1 ejects ink droplets by the following operation.

First, ink is taken in from an ink introduction port coupled to an external ink supply unit (not shown), and an inside of the recording head 1 is filled with ink from the manifold 100 to the nozzles 21. Thereafter, according to a recording signal from the drive circuit 120, a voltage is applied between the first electrode 60 and the second electrode 80 corresponding to each pressure generation chamber 12, and the piezoelectric element 300 is deflected and deformed. Accordingly, a pressure in each pressure generation chamber 12 is increased, and ink droplets are ejected from the nozzles 21.

Piezoelectric Element

Figure 5:
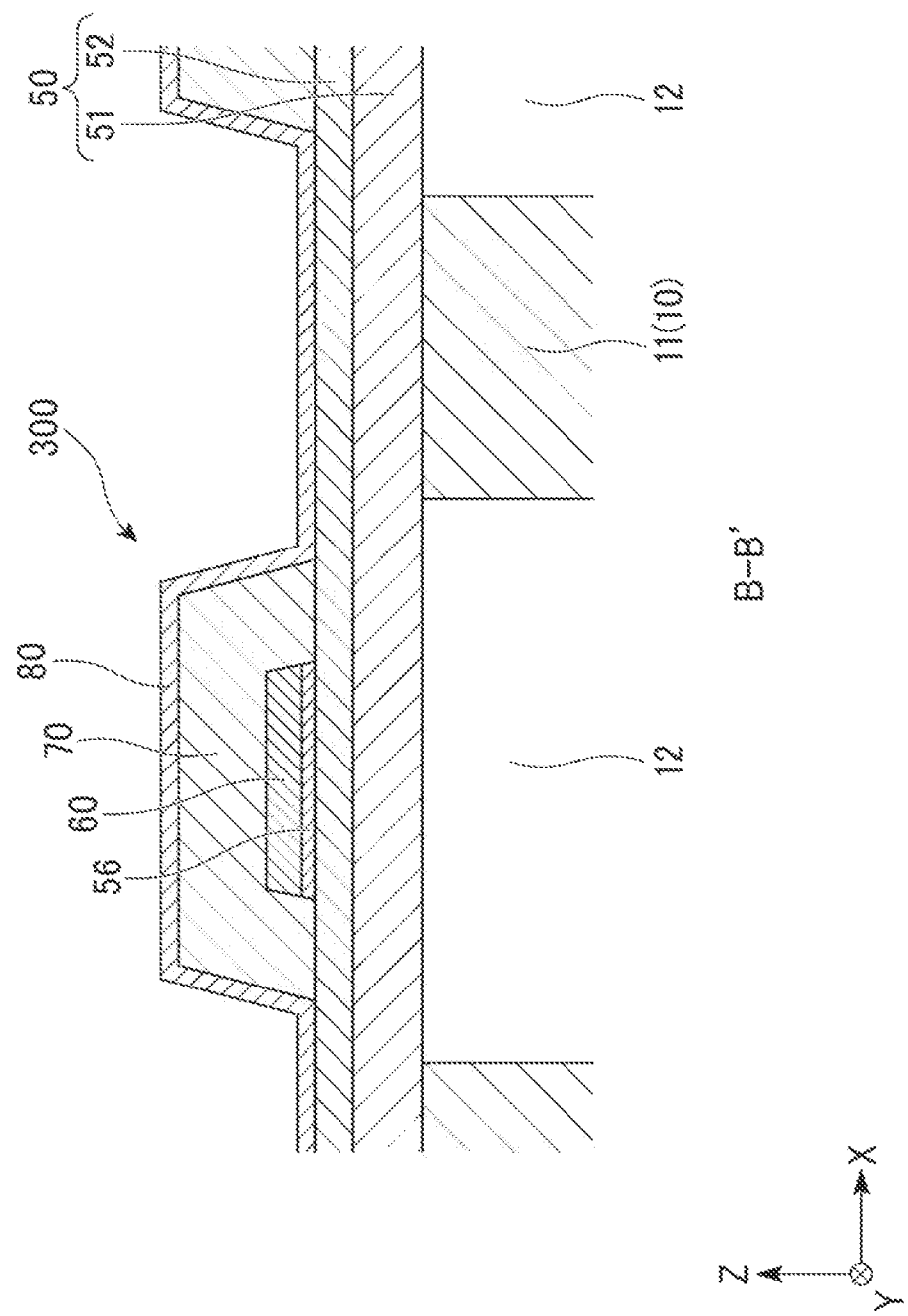
FIG. 5 is an enlarged cross-sectional view taken along a line B-B' in FIG. 4.

Next, a configuration of the piezoelectric element 300 will be described with reference to the drawings. FIG. 5 is an enlarged cross-sectional view taken along a line B-B' in FIG. 4.

As shown in the drawing, the piezoelectric element 300 includes the substrate 10, the first electrode 60 formed on the substrate 10, the piezoelectric layer 70 formed on the first electrode 60 and containing potassium, sodium, and niobium, and the second electrode 80 formed on the piezoelectric layer 70.

The substrate 10 is provided with pressure generation chambers 12 partitioned by a plurality of partition walls 11. With such a configuration, the movable portion of the piezoelectric element 300 is formed. Thicknesses of the elements described herein are merely examples, and can be changed without departing from the scope of the present disclosure.

A material for the first electrode 60 and a material for the second electrode 80 are preferably a noble metal such as platinum (Pt) or iridium (Ir) or an oxide thereof. The material for the first electrode 60 and the material for the second electrode 80 may be any material having conductivity. The material for the first electrode 60 and the material for the second electrode 80 may be the same or different.

The substrate 10 is, for example, a flat plate formed of a semiconductor or an insulator. The substrate 10 may be a single layer or a structure in which a plurality of layers are stacked. The substrate 10 may include a diaphragm which has flexibility and can be deformed (bent) by fluctuation in the piezoelectric layer 70. Examples of a material for the diaphragm include silicon oxide, zirconium oxide, and a stacked body thereof.

As described above, the diaphragm 50 including the elastic film 51 and the insulator film 52 is formed on the other surface (a surface at the +Z direction side) of the substrate 10. The elastic film 51 is preferably made of, for example, silicon dioxide ($SiO_2$), and the insulator film 52 preferably contains, for example, zirconium oxide ($ZrO_2$). By applying zirconium oxide as the insulator film 52, a Young's modulus of the diaphragm 50 itself can be increased. As a result, it is possible to prevent deflection of the diaphragm 50 due to a stress from the piezoelectric layer 70 or the second electrode 80 in a state in which no voltage is applied. From this viewpoint, the insulator film 52 is preferably made of zirconium oxide.

The first electrode 60 is formed on the substrate 10 (the diaphragm 50 in FIG. 5). A shape of the first electrode 60 is, for example, a layer shape or a thin film shape. A thickness (a length in a Z-axis direction) of the first electrode 60 is, for example, 50 nm or more and 300 nm or less. A planar shape (a shape viewed from the Z-axis direction) of the first electrode 60 is not particularly limited as long as the piezoelectric layer 70 can be disposed between the first electrode 60 and the second electrode 80 when the second electrode 80 faces the first electrode 60.

Examples of the material for the first electrode 60 include various metals such as nickel, iridium, and platinum, conductive oxides thereof (for example, iridium oxide), a composite oxide of strontium and ruthenium (SrRuOx:SRO), and a composite oxide of lanthanum and nickel (LaNiOx:LNO). The first electrode 60 may have a single-layer structure of the materials shown above, or may have a structure in which a plurality of materials are stacked.

The first electrode 60 can be paired with the second electrode 80 and serve as one electrode (for example, a lower electrode formed below the piezoelectric layer 70) for applying a voltage to the piezoelectric layer 70.

The diaphragm 50 may be omitted, and the first electrode 60 may also function as a diaphragm. That is, the first electrode 60 may have a function as one electrode for applying a voltage to the piezoelectric layer 70 and a function as a diaphragm which can be deformed by fluctuation in the piezoelectric layer 70.

For example, a layer (for example, the adhesion layer 56) which provides adhesion between the first electrode 60 and the substrate 10 or a layer which provides strength or conductivity may be formed between the first electrode 60 and the substrate 10. Examples of such a layer include layers of various metals such as titanium, nickel, iridium, and platinum, and oxides thereof.

For example, a seed layer (also referred to as an orientation control layer) is preferably provided between the first electrode 60 and the piezoelectric layer 70. The seed layer has a function of controlling orientation of a crystal of the piezoelectric substance constituting the piezoelectric layer 70. That is, by providing the seed layer, it is possible to preferentially orient the crystal of the piezoelectric substance constituting the piezoelectric layer 70 in predetermined orientation, and as a result, it is possible to sufficiently increase hardness of the piezoelectric layer 70.

The piezoelectric layer 70 is formed on the first electrode 60. A thickness of the piezoelectric layer 70 is, for example, 50 nm or more and 2000 nm or less.

The piezoelectric layer 70 is formed by a solution method (also referred to as a liquid phase method or a wet method) such as a MOD method or a sol-gel method, or a gas phase method such as a sputtering method. In the embodiment, the piezoelectric layer 70 is a perovskite composite oxide that is represented by a general formula $ABO_3$ containing potassium (K), sodium (Na), and niobium (Nb), and that is formed by a solution method. That is, the piezoelectric layer 70 contains a piezoelectric material made of a KNN-based composite oxide represented by the following formula (1).

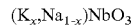

$$(K_x,Na_{1-x})NbO_3$$

$$(0.1 \leq x \leq 0.9) \tag{1}$$

The piezoelectric material constituting the piezoelectric layer 70 may be a KNN-based composite oxide, and is not limited to a composition represented by the above formula (1). For example, another metal element (additive) may be contained in a A site or a B site of potassium sodium niobate. Examples of such additives include manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn) and copper (Cu).

One or more additives of this kind may be contained. In general, an amount of the additives is 20% or less, preferably 15% or less, and more preferably 10% or less with respect to a total amount of elements serving as a main component. By using the additive, it is easy to improve various characteristics to diversify the configuration and function, and presence of more than 80% of KNN is preferred from the viewpoint of exhibiting characteristics derived from KNN.

Also in the case of a composite oxide containing these other elements, it is preferable that the composite oxide has an $ABO_3$ perovskite structure.

In the present description, the "perovskite composite oxide containing K, Na, and Nb" is "a composite oxide having an $ABO_3$ perovskite structure containing K, Na, and Nb", and is not limited to only a composite oxide having an $ABO_3$ perovskite structure containing K, Na, and Nb. That is, in the present description, the "perovskite composite oxide containing K, Na, and Nb" includes a piezoelectric material represented as a mixed crystal containing a composite oxide having an $ABO_3$ perovskite structure containing K, Na, and Nb (for example, the KNN-based composite oxide shown above) and another composite oxide having an $ABO_3$ perovskite structure.

The other composite oxide is not limited within the scope of the embodiment, and is preferably a non-lead-based piezoelectric material which does not contain lead (Pb). According to this, the piezoelectric element 300 is excellent in biocompatibility and has low environmental loading.

The piezoelectric layer 70 according to the embodiment is a KNN-based piezoelectric thin film having a Young's modulus of 130 GPa or more. By setting the Young's modulus of the piezoelectric layer 70 to 130 GPa or more, a decrease in piezoelectric characteristics of the piezoelectric layer 70, which is extremely excellent as compared with that of a KNN thin film in the related art, can be prevented. Specifically, even at the time of driving at a high voltage (for example, 20 V to 50 V), it is possible to reduce a decrease in efficiency of the displacement amount (linearity) of the diaphragm. Preferably, the Young's modulus of the piezoelectric layer 70 is 150 GPa or more. On the other hand, an upper limit of the Young's modulus of the piezoelectric layer 70 is not particularly limited, but may be set to 200 GPa or less because displacement itself is hindered when the Young's modulus of the piezoelectric layer 70 is too large.

The Young's modulus of the piezoelectric layer 70 according to the embodiment is at a high level of 130 GPa or more. By increasing the Young's modulus in this way, the piezoelectric layer 70 can be sufficiently hardened, and as a result, even when a high voltage is applied, deformation of the piezoelectric layer 70 itself can be avoided, and a decrease in the efficiency of the displacement amount of the diaphragm can be prevented. Further, by sufficiently hardening the piezoelectric layer 70, deformation of the piezoelectric layer 70 due to a stress from the second electrode 80 can be reduced, and initial deflection of the diaphragm 50 can be reduced.

From such a viewpoint, a ratio of the Young's modulus of the piezoelectric layer 70 to a Young's modulus of the second electrode 80 is preferably 0.8 or more and 1.0 or less. By providing the second electrode 80 and the piezoelectric layer 70 which satisfy the ratio within this range, it is possible to further reduce deformation of the piezoelectric layer 70 due to a stress from the second electrode 80.

Here, the Young's modulus of the piezoelectric layer 70 is measured by the following method.

The Young's modulus was measured based on nanoindenter measurement. In the embodiment, the nanoindenter measurement is performed using UMIS-2000 manufactured by CSIRO. That is, the Young's modulus is calculated when an indenter having a spherical tip end is pushed into a surface of the piezoelectric layer 70, based on a load applied to the indenter and a projected area under the indenter.

As described above, in order to reduce a decrease in the efficiency of the displacement amount (linearity) of the diaphragm, it is effective to sufficiently harden the piezoelectric layer 70. In order to increase the hardness of the piezoelectric layer 70, it is effective to increase a density of the piezoelectric layer 70. Specifically, the density of the piezoelectric layer 70 is preferably 4.41 $g/cm^3$ or more. More preferably, the density of the piezoelectric layer 70 is 4.50 $g/cm^3$ or more. On the other hand, an upper limit of the density of the piezoelectric layer 70 is not particularly limited, and may be set to 4.77 $g/cm^3$ or less from the viewpoint of not including a foreign matter having no piezoelectricity.

A preferable method for controlling the Young's modulus and the density of the piezoelectric layer 70 will be described later.

The second electrode 80 is formed on the piezoelectric layer 70. The second electrode 80 faces the first electrode 60 with the piezoelectric layer 70 interposed between the second electrode 80 and the first electrode 60. A shape of the second electrode 80 is, for example, a layer shape or a thin film shape. A thickness of the second electrode 80 is, for example, 10 nm or more and 500 nm or less. A planar shape of the second electrode 80 is not particularly limited as long as the piezoelectric layer 70 can be disposed between the first electrode 60 and the second electrode 80 when the second electrode 80 faces the first electrode 60.

As the material for the second electrode 80, for example, the materials listed above as the material for the first electrode 60 can be applied. In order that the ratio of the Young's modulus of the piezoelectric layer 70 to the Young's modulus of the second electrode 80 satisfies the above range, it is preferable to use platinum (Pt) as the material for the second electrode 80.

One of functions of the second electrode 80 is that the second electrode 80 is paired with the first electrode 60 and serves as the other electrode (for example, an upper electrode formed at an upper part of the piezoelectric layer 70) for applying a voltage to the piezoelectric layer 70.

According to the piezoelectric element 300 in a first embodiment described above, by sufficiently increasing the Young's modulus of the piezoelectric layer 70, it is possible to improve the efficiency of the displacement amount at the time of driving at a high voltage (for example, 20 V to 50 V).

In the above embodiment, the ink jet recording head is described as an example of a liquid ejection head. However, the present disclosure is applicable to liquid ejection heads in general, and is also applicable to a liquid ejection head for ejecting a liquid other than ink. Examples of other liquid ejection heads include various recording heads used in image recording devices such as printers, color material ejection heads used for manufacturing color filters for liquid crystal displays, electrode material ejection heads used for forming electrodes for organic EL displays and field emission displays (FEDs), and bioorganic material ejection heads used for manufacturing biochips.

The present disclosure is not limited to the piezoelectric element mounted on the liquid ejection head, and can also be applied to a piezoelectric element mounted on another piezoelectric element application device. Examples of the piezoelectric element application device include an ultrasonic device, a motor, a pressure sensor, a pyroelectric element, and a ferroelectric element. Completed bodies using these piezoelectric element application devices, for example, an ejection device of a liquid or the like using an ejection head for the liquid or the like, an ultrasonic sensor using the ultrasonic device, a robot using the motor as a driving source, an IR sensor using the pyroelectric element, and a ferroelectric memory using the ferroelectric element are also in the piezoelectric element application device.

In particular, the piezoelectric element according to the present disclosure is suitable as a piezoelectric element to be mounted on a sensor. Examples of the sensor include a gyro sensor, an ultrasonic sensor, a pressure sensor, and a speed and acceleration sensor. When the piezoelectric element according to the present disclosure is applied to a sensor, for example, a voltage detection unit which detects a voltage output from the piezoelectric element 300 is provided between the first electrode 60 and the second electrode 80 to form the sensor. In a case of such a sensor, when the piezoelectric element 300 is deformed due to some external change (change in physical quantity), a voltage is generated according to the deformation. Various physical quantities can be detected by detecting the voltage with the voltage detection unit.

Next, an example of a method for producing the piezoelectric element 300 will be described.

First, the substrate (silicon substrate) 10 is prepared, and by thermally oxidizing the substrate 10, the elastic film 51 made of silicon dioxide ($SiO_2$) is formed at a surface of the substrate 10.

Next, a zirconium film is formed on the elastic film 51 by a sputtering method, a vapor deposition method, or the like, and the zirconium film is thermally oxidized to obtain the insulator film 52 made of zirconium oxide ($ZrO_2$). In this way, the diaphragm 50 including the elastic film 51 and the insulator film 52 is formed on the substrate 10.

Next, the adhesion layer 56 made of $TiO_X$ is formed on the insulator film 52. The adhesion layer 56 can be formed by a sputtering method, thermal oxidation of a Ti film, or the like. Next, the first electrode 60 made of Pt is formed on the adhesion layer 56. The first electrode 60 can be appropriately selected according to an electrode material, and can be formed by vapor phase deposition by a sputtering method, a vacuum deposition method (PVD method), a laser ablation method, or the like, or liquid phase deposition by a spin coating method or the like.

Next, a resist having a predetermined shape is formed on the first electrode 60 as a mask, and the adhesion layer 56 and the first electrode 60 are simultaneously patterned. Patterning of the adhesion layer 56 and the first electrode 60 can be performed by, for example, dry etching such as reactive ion etching (RIE) or ion milling, or wet etching using an etchant. Shapes of the adhesion layer 56 and the first electrode 60 in the patterning are not particularly limited.

Next, a plurality of layers of piezoelectric films are formed on the first electrode 60.

The piezoelectric layer 70 is implemented by the plurality of piezoelectric films. The piezoelectric layer 70 can be formed by, for example, a chemical solution method (wet method) of obtaining a metal oxide by applying and drying a solution containing a metal complex (precursor solution), and then performing firing at a high temperature. In addition, the piezoelectric layer 70 can be formed by a laser ablation method, a sputtering method, a pulse laser deposition method (PLD method), a chemical vapor deposition (CVD) method, an aerosol deposition method, or the like. In the embodiment, it is preferable to use a wet method (liquid phase method) from the viewpoint of orienting orientation of the piezoelectric layer 70 in a (100) direction and increasing the Young's modulus of the piezoelectric layer 70.

Here, the wet method (liquid phase method) is a method for deposition by a chemical solution method such as a MOD method or a sol-gel method, and is a concept distinguished from a gas phase method such as a sputtering method. In the embodiment, a gas phase method may be used as long as the piezoelectric layer 70 can be formed in which the orientation is oriented in the (100) direction.

For example, the piezoelectric layer 70 formed by a wet method (liquid phase method) includes a plurality of piezoelectric films 74 formed by a series of steps including a step of applying a precursor solution and forming a precursor film (applying step), a step of drying the precursor film (drying step), a step of heating and degreasing the dried precursor film (degreasing step), and a step of firing the degreased precursor film (firing step). That is, the piezoelectric layer 70 is formed by repeating a series of steps from the applying step to the firing step a plurality of times. In the series of steps described above, the firing step may be performed after repeating the steps from the applying step to the degreasing step a plurality of times.

A layer or film formed by the wet method has an interface. The layer or film formed by the wet method leaves a trace of applying or firing, and such a trace becomes the interface which can be checked by observing a cross section thereof or analyzing a concentration distribution of elements in the layer (or in the film). Strictly speaking, the interface refers to a boundary between layers or between films, but here refers to a vicinity of a boundary of layers or films. When a cross section of a layer or film formed by the wet method is observed with an electron microscope or the like, such an interface is checked as a portion having a color darker than other portions or a portion having a color lighter than other portions in a vicinity of a boundary with an adjacent layer or film. When the concentration distribution of the elements is analyzed, such an interface is checked as a portion having a higher concentration of elements than other portions or a portion having a lower concentration of elements than other portions in a vicinity of a boundary with an adjacent layer or film. The piezoelectric layer 70 is formed by repeating a series of steps from the applying step to the firing step a plurality of times, or by performing the firing step after repeating a series of steps from the applying step to the degreasing step a plurality of times (constituted by a plurality of layers of piezoelectric films 74), and therefore has a plurality of interfaces corresponding to the piezoelectric films 74.

A specific procedure for forming the piezoelectric layer 70 by a wet method (liquid phase method) is, for example, as follows.

First, a precursor solution containing a predetermined metal complex is prepared. The precursor solution is obtained by dissolving or dispersing a metal complex capable of forming a composite oxide containing K, Na, and Nb by firing in an organic solvent. At this time, a metal complex containing an additive such as Mn may be further mixed. By mixing the metal complex containing Mn with the precursor solution, it is possible to further increase the Young's modulus of the obtained piezoelectric layer 70.

Examples of a metal complex containing potassium (K) include potassium 2-ethylhexanoate and potassium acetate. Examples of a metal complex containing sodium (Na) include sodium 2-ethylhexanoate and sodium acetate. Examples of a metal complex containing niobium (Nb) include niobium 2-ethylhexanoate and pentaethoxyniobium. When Mn is added as the additive, examples of the metal complex containing Mn include manganese 2-ethylhexanoate. At this time, two or more metal complexes may be used in combination. For example, potassium 2-ethylhexanoate and potassium acetate may be used in combination as the metal complex containing potassium (K). Examples of a solvent include 2-n-butoxyethanol, n-octane, and a mixed solvent thereof. The precursor solution may contain an additive which stabilizes dispersion of the metal complex containing K, Na, and Nb. Examples of such additives include 2-ethylhexanoic acid.

The precursor solution is applied onto the substrate 10 on/above which the elastic film 51, the insulator film 52, and the first electrode 60 are formed to form a precursor film (applying step).

Next, the precursor film is heated at a predetermined temperature, for example, about 130° C. to 250° C. and is dried for a certain period of time (drying step).

A temperature increase rate in the drying step is preferably 30° C./sec to 350° C./sec. By firing the piezoelectric film at such a temperature increase rate using the solution method, the piezoelectric layer 70 which is not a pseudo-cubic crystal can be implemented. The term "temperature increase rate" as used herein defines a rate of change over time of a temperature from 350° C. to a target firing temperature.

Next, the dried precursor film is heated to a predetermined temperature, for example, 350° C. to 500° C., and is held at this temperature for a certain period of time to perform degreasing (degreasing step).

A heating temperature in the degreasing step is preferably 350° C. or higher from the viewpoint of increasing the Young's modulus of the piezoelectric layer 70. More preferably, the heating temperature is 370° C. or higher. On the other hand, when the heating temperature in the degreasing step is excessively high, foreign matters may be formed by an undesirable reaction. Therefore, the heating temperature is preferably 420° C. or lower.

A heating time in the degreasing step is preferably 2 minutes or longer from the viewpoint of increasing the Young's modulus of the piezoelectric layer 70. More preferably, the heating time is 3 minutes or longer. On the other hand, when the heating time in the degreasing step is excessively long, a carbon component which was removed by the degreasing may reattach. Therefore, the heating time is preferably 7 minutes or shorter.

Finally, the degreased precursor film is heated to a high temperature, for example, about 650° C. to 800° C., and is held at this temperature for a certain period of time to be crystallized. Accordingly, the piezoelectric film is completed (firing step).

In the firing step, it is preferable to crystallize the precursor film while applying pressure. By performing the firing step while applying pressure, the hardness of the piezoelectric layer 70 can be improved, and the Young's modulus can be further increased. A pressurization condition is preferably 0.005 MPa or more with respect to the atmospheric pressure. On the other hand, when a pressure at the time of firing is excessively high, process gas is excessively taken into the film, and an unexpected reaction may occur. Therefore, a pressure at the time of pressurization is preferably 0.9 MPa or less with respect to the atmospheric pressure.

A heating temperature in the firing step is preferably 650° C. or higher from the viewpoint of increasing the Young's modulus of the piezoelectric layer 70. More preferably, the heating temperature is 700° C. or higher. On the other hand, when the heating temperature in the firing step is excessively high, an alkali metal component may diffuse into the lower electrode, a metal material constituting the lower electrode may be dissolved, or the like. Therefore, the heating temperature is preferably 760° C. or lower.

A heating time in the firing step is preferably 1 minute or longer from the viewpoint of increasing the Young's modulus of the piezoelectric layer 70. More preferably, the heating time is 2 minutes or longer. On the other hand, if the heating time in the firing step is excessively long, the alkali metal component may diffuse into the lower electrode. Therefore, the heating time is preferably 8 minutes or shorter.

Examples of a heating device used in the drying step, the degreasing step, and the firing step include a rapid thermal annealing (RTA) device which performs heating by irradiation with an infrared lamp, and a hot plate. The above steps are repeated a plurality of times to form the piezoelectric layer 70 including a plurality of layers of piezoelectric films. In a series of steps from the applying step to the firing step, the firing step may be performed after repeating the steps from the applying step to the degreasing step a plurality of times.

Before and after the second electrode 80 is formed on the piezoelectric layer 70, a reheat treatment (post-annealing) may be performed in a temperature range of 600° C. to 800° C. as necessary. By performing the post-annealing thus, a good interface between the piezoelectric layer 70 and the first electrode and a good interface between the piezoelectric layer 70 and the second electrode 80 can be formed. Crystallinity of the piezoelectric layer 70 can be improved, and the Young's modulus of the piezoelectric layer 70 can be further increased.

After the firing step, the piezoelectric layer 70 implemented by a plurality of piezoelectric films is patterned into a shape as shown in FIG. 5. Patterning can be performed by dry etching such as reactive ion etching or ion milling, or wet etching using an etchant.

Thereafter, the second electrode 80 is formed on the piezoelectric layer 70. The second electrode 80 can be formed by a similar method as the first electrode 60.

By the above steps, the piezoelectric element 300 including the first electrode 60, the piezoelectric layer 70, and the second electrode 80 is produced.

EXAMPLE

Hereinafter, the present disclosure will be described in more detail with reference to Example, and the present disclosure is not limited to Example.

Example 1

First, a surface of a silicon substrate (6 inches) serving as the substrate was thermally oxidized, and an elastic film (1370 nm) made of silicon dioxide was formed on the substrate. Further, a zirconium film was formed on the elastic film by a sputtering method, and the zirconium film was thermally oxidized to form an insulator film (400 nm) made of zirconium oxide ($ZrO_2$). In this way, a diaphragm including the elastic film and the insulator film was formed on the substrate.

Next, a first electrode (135 nm) made of platinum (Pt) was formed on the diaphragm by a sputtering method, a resist having a predetermined shape was used as a mask, and the first electrode 60 was patterned by RIE.

Next, a piezoelectric layer was formed on the first electrode by the following procedure.

First, a precursor solution containing potassium 2-ethylhexanoate, sodium 2-ethylhexanoate, lithium 2-ethylhexanoate, niobium 2-ethylhexanoate, and manganese 2-ethylhexanoate was applied onto the base substrate by a spin coating method to form a precursor film (applying step).

Thereafter, the precursor film was dried at 180° C. (drying step), and then was degreased at 380° C. for 3 minutes (degreasing step).

Next, the degreased precursor film was subjected to a heat treatment at 750° C. for 3 minutes using rapid thermal annealing (RTA) under a pressurized atmosphere of 0.01 MPa with respect to the atmospheric pressure to form a piezoelectric film (firing step). The steps from the applying step to the firing step were repeated a plurality of times to produce a piezoelectric layer made of a plurality of piezoelectric films and having a total film thickness of 1060 nm and a Young's modulus of 155 GPa. The Young's modulus was measured by a nanoindentation method in a similar manner as described above.

Finally, a second electrode made of platinum (Pt) was formed on the piezoelectric layer in a similar manner as the first electrode, a piezoelectric element is obtained.

Comparative Example 1

Comparative Example 1 was the same as Example 1 except that the Young's modulus of the piezoelectric layer was 125 GPa and the total film thickness was 1200 nm.

For each of Example and Comparative Example described above, an initial deflection amount of a diaphragm and a displacement amount of the diaphragm when a voltage is applied were examined. Results are shown in Table 1, and FIGS. 6A and 6B.

The initial deflection amount was obtained as follows.
Initial Deflection Amount With respect to the piezoelectric elements in Example 1 and Comparative Example 1, the displacement amount (initial deflection amount) when a voltage is applied was obtained. Here, the displacement amount at room temperature (25° C.) was obtained using a displacement measurement device (laser Doppler displacement meter).

TABLE 1

| | Initial deflection amount (nm) |
|---|---|
| Example 1 | 526 |
| Comparative Example 1 | 607 |

Test Results

As shown in Table 1, according to Example 1, initial deflection was reduced by about 13% as compared with that in Comparative Example 1.

Figure 6A:
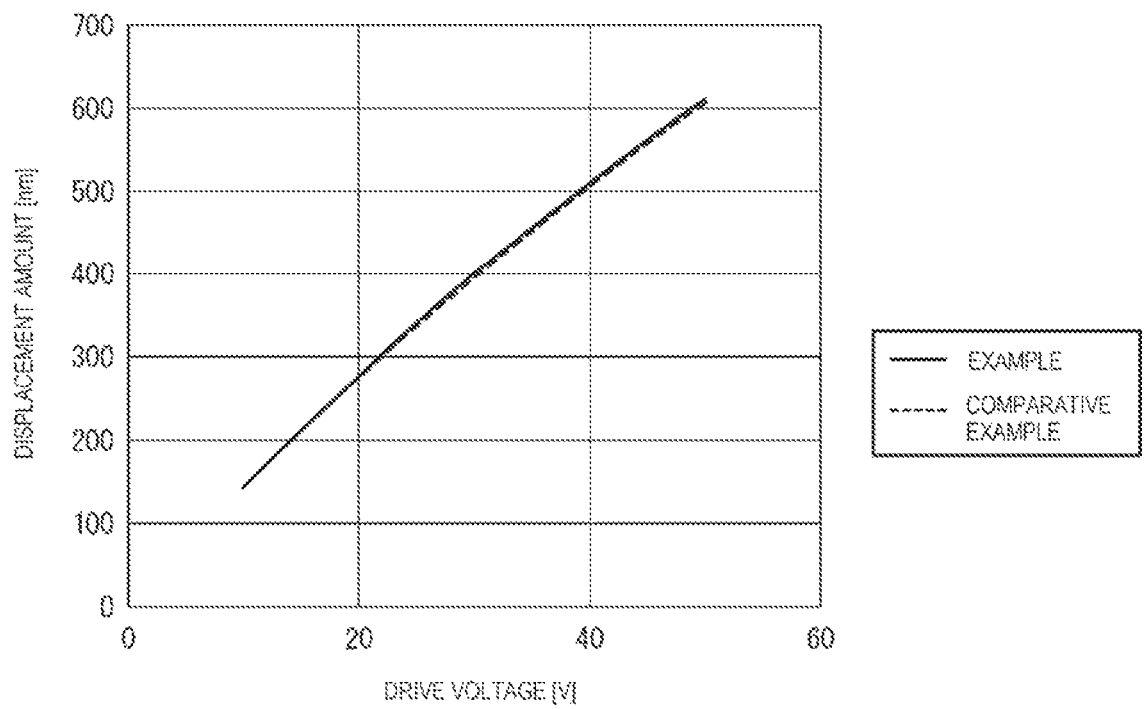
FIG. 6A is a diagram showing a relation between a drive voltage and a displacement amount of the diaphragm in the embodiment.
Figure 6B:
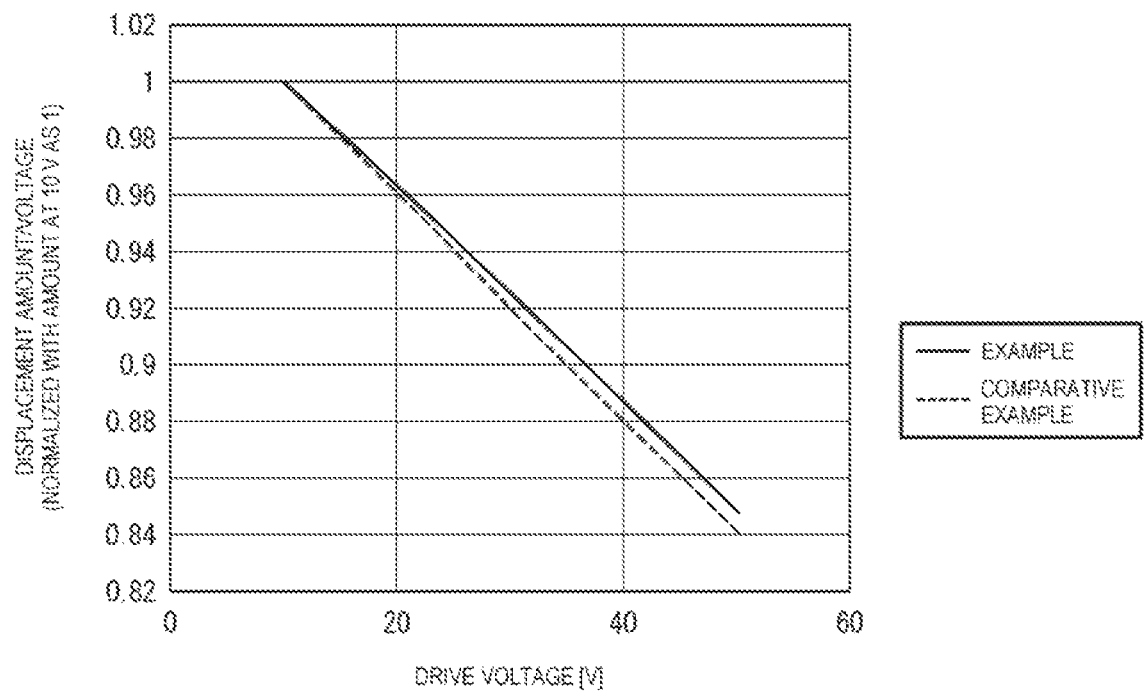
FIG. 6B is a diagram showing a relation between the drive voltage and efficiency of the displacement amount of the diaphragm in the embodiment.

FIG. 6A shows a displacement amount of a diaphragm when a voltage is applied in each of Example 1 and Comparative Example 1. FIG. 6B shows efficiency of a displacement amount (linearity) of the diaphragm when a voltage is applied in each of Example 1 and Comparative Example 1. A vertical axis in FIG. 6B indicates "displacement amount/voltage", and is normalized with a displacement amount at a drive voltage of 10 V as 1.

As shown in FIG. 6A, in a region of 20 V or larger, according to Example 1, a larger displacement amount was obtained as compared with that in Comparative Example 1, and a large difference was not observed between Example 1 and Comparative Example 1. On the other hand, as shown in FIG. 6B, in terms of the efficiency of the displacement amount (linearity) at a high voltage, it was found that the efficiency of the displacement amount can be controlled better according to Example 1 as compared with that in Comparative Example 1, and the piezoelectric element according to Example 1 was a piezoelectric element having higher efficiency even at a high voltage.

What is claimed is:

1. A piezoelectric element comprising:
   a first electrode;
   a piezoelectric layer formed at an upper part of the first electrode; and
   a second electrode formed at an upper part of the piezoelectric layer, wherein
   the piezoelectric layer contains potassium, sodium, and niobium, and
   a Young's modulus of the piezoelectric layer measured by a nanoindentation method exceeds 130 GPa.

2. The piezoelectric element according to claim 1, wherein
   a ratio of the Young's modulus of the piezoelectric layer to a Young's modulus of the second electrode is 0.8 or more and 1 or less.

3. The piezoelectric element according to claim 1, further comprising:
   a substrate disposed at an opposite side from the piezoelectric layer with the first electrode interposed between the piezoelectric layer and the substrate, wherein
   the substrate contains zirconium oxide.

4. A head chip comprising:
   a nozzle plate including a nozzle for ejecting a liquid droplet;
   a pressure generation chamber communicating with the nozzle;
   a flow path forming substrate disposed on the nozzle plate and forming the pressure generation chamber;
   a diaphragm forming a part of a wall surface of the pressure generation chamber;
   the piezoelectric element according to claim 1 provided on the diaphragm; and
   a voltage application portion configured to apply a voltage to the piezoelectric element.

5. A liquid ejection device comprising:
   a conveyance unit configured to convey media; and
   a liquid droplet ejection head configured to apply a liquid droplet to the media, wherein
   the liquid droplet ejection head includes the head chip according to claim 4.

6. A sensor comprising:
   the piezoelectric element according to claim 1; and
   a voltage detection unit configured to detect a voltage output from the piezoelectric element.

7. The piezoelectric element according to claim 1, wherein a density of the piezoelectric layer is greater than 4.60 g/cm$^3$ and 4.77 g/cm$^3$ or less.

* * * * *